United States Patent
Shiomi et al.

(10) Patent No.: US 10,580,913 B2
(45) Date of Patent: Mar. 3, 2020

(54) SEMICONDUCTOR NANOPARTICLE DISPERSION, A PHOTOELECTRIC CONVERSION ELEMENT, AND AN IMAGE PICKUP DEVICE FOR SUBSTANTIALLY UNIFORM ABSORPTION EDGE WAVELENGTH

(71) Applicant: SONY CORPORATION, Tokyo (JP)

(72) Inventors: Michinori Shiomi, Kanagawa (JP); Takeru Bessho, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 16/023,515

(22) Filed: Jun. 29, 2018

(65) Prior Publication Data

US 2018/0308994 A1 Oct. 25, 2018

Related U.S. Application Data

(63) Continuation of application No. 15/038,216, filed as application No. PCT/JP2014/006291 on Dec. 17, 2014, now Pat. No. 10,014,422.

(30) Foreign Application Priority Data

Dec. 27, 2013 (JP) .................. 2013-273094

(51) Int. Cl.
*H01L 27/146* (2006.01)
*H01L 31/0296* (2006.01)
*H01L 21/02* (2006.01)

(52) U.S. Cl.
CPC .... *H01L 31/02963* (2013.01); *H01L 21/0256* (2013.01); *H01L 21/02562* (2013.01); *H01L 21/02601* (2013.01); *H01L 21/02628* (2013.01)

(58) Field of Classification Search
CPC ................................ H01L 31/02963
USPC ......................................... 257/443
See application file for complete search history.

(56) References Cited

U.S. PATENT DOCUMENTS

| 7,005,229 B2 * | 2/2006 | Nirmal .................. G03F 7/0047 430/270.1 |
| 9,318,632 B2 * | 4/2016 | Lewis ............. H01L 31/035218 |
| 9,716,230 B2 * | 7/2017 | Tang ..................... H01L 51/502 |
| 2004/0067433 A1 * | 4/2004 | Nirmal .................. G03F 7/0047 430/270.1 |
| 2004/0150865 A1 | 8/2004 | Chen et al. |

(Continued)

FOREIGN PATENT DOCUMENTS

| JP | 10-160574 A | 6/1998 |
| JP | 2006-245285 A | 9/2006 |

(Continued)

OTHER PUBLICATIONS

Xinhua Zhong, Alloyed ZnxCd1-xS Nanocrystals with Highly Narrow Luminescence Spectral Width, 2003, J. Am. Chem. Soc. 2003, 125, 13559-13563 (Year: 2003).*

(Continued)

*Primary Examiner* — Caleb E Henry
(74) *Attorney, Agent, or Firm* — Chip Law Group

(57) ABSTRACT

A semiconductor nanoparticle dispersion is provided. The semiconductor nanoparticle including a plurality of semiconductor nanoparticles having a radius equal to or larger than an exciton Bohr radius; and a solvent dispersed with the plurality of semiconductor nanoparticles.

18 Claims, 11 Drawing Sheets

(56) References Cited

U.S. PATENT DOCUMENTS

| | | |
|---|---|---|
| 2009/0074653 A1 | 3/2009 | Chen et al. |
| 2011/0076839 A1 | 3/2011 | Ren et al. |
| 2013/0037111 A1 | 2/2013 | Mitzi et al. |
| 2013/0299772 A1 | 11/2013 | Cohen et al. |
| 2014/0306179 A1 | 10/2014 | Demir et al. |
| 2015/0129838 A1 | 5/2015 | Lewis et al. |

FOREIGN PATENT DOCUMENTS

| | | |
|---|---|---|
| JP | 2010-177392 A | 8/2010 |
| JP | 2012-253004 A | 12/2012 |
| JP | 5358790 B2 | 12/2013 |
| TW | I242539 B | 11/2005 |

OTHER PUBLICATIONS

Debasis Bera, Quantum Dots and Their Multimodal Applications: A Review, 2010, Materials, 3, 2260-2345; (Year: 2010).*

Tomá Skeren, Quantum nanostructures: theoretical analysis and modeling, 2008, Czech Technical University in Prague, Faculty of Nuclear Sciences and Physical Engineering (Year: 2008).*

Ephrem O. Chukwuocha,Theoretical Studies on the Effect of Confinement on Quantum Dots Using the Brus Equation, 2012, World Journal of Condensed Matter Physics, 2012, 2, 96-100 (Year: 2012).*

Wu, et al., "Microwave-Assisted Synthesis and Highly Photocatalytic Activity of MWCNT/ZNSE Heterostructures", Materials Chemistry and Physics, vol. 113, Issues 2-3, Aug. 2008, 06 pages.

Norberg, et al., "Giant Excitonic Zeeman Splittings in Colloidal Co2+-Doped ZnSe Quantum Dots", Journal of the American Chemical Society, vol. 128, Issue 40, 2006, pp. 13195-13203.

Sagadevan Suresh, "Semiconductor Nanomaterials, Methods and Applications: A Review", Nanoscience and Nanotechnology, vol. 3, Issue 3, 2013, pp. 62-74.

Gourgon, et al., "Anisotropic center-of-mass Quantization of Excitons in CdTe/CdZnTe Quantum Wells", Journal Crystal Growth, vol. 159, 1996, pp. 537-541.

Non-Final Office Action for U.S. Appl. No. 15/038,216, dated Jun. 2, 2017, 17 pages.

Final Office Action for U.S. Appl. No. 15/038,216, dated Nov. 14, 2017, 20 pages.

Advisory Action for U.S. Appl. No. 15/038,216, dated Jan. 31, 2018, 3 pages.

Notice of Allowance for U.S. Appl. No. 15/038,216, dated Mar. 9, 2018, 8 pages.

International Search Report and Written Opinion of PCT Application No. PCT/JP2014/006291, dated Jan. 4, 2015, 09 pages of ISRWO.

International Preliminary Report on Patentability of PCT Application No. PCT/JP2014/006291, dated Jul. 7, 2016, 07 pages of IPRP.

* cited by examiner

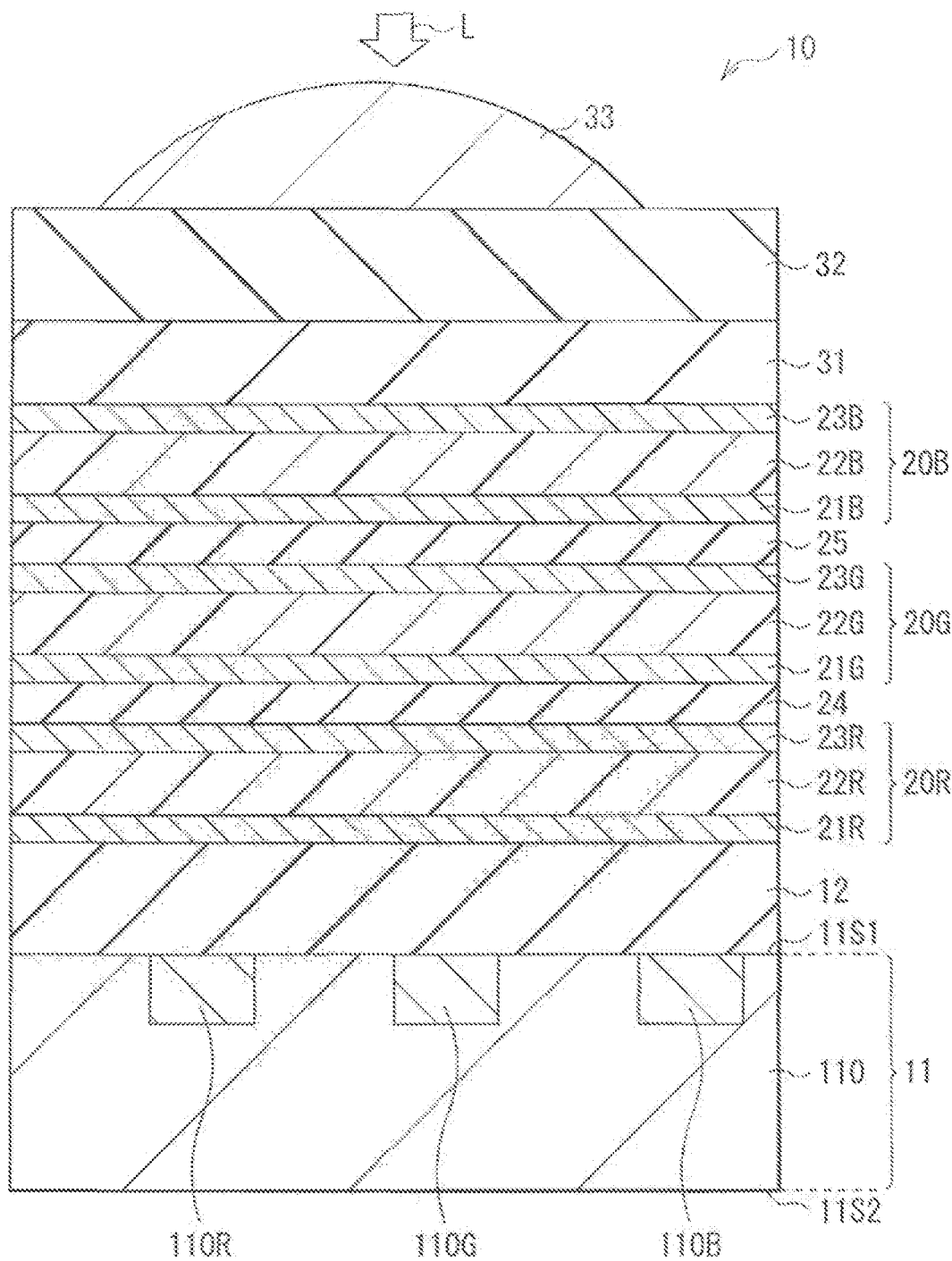
[FIG. 1]

[FIG. 2]
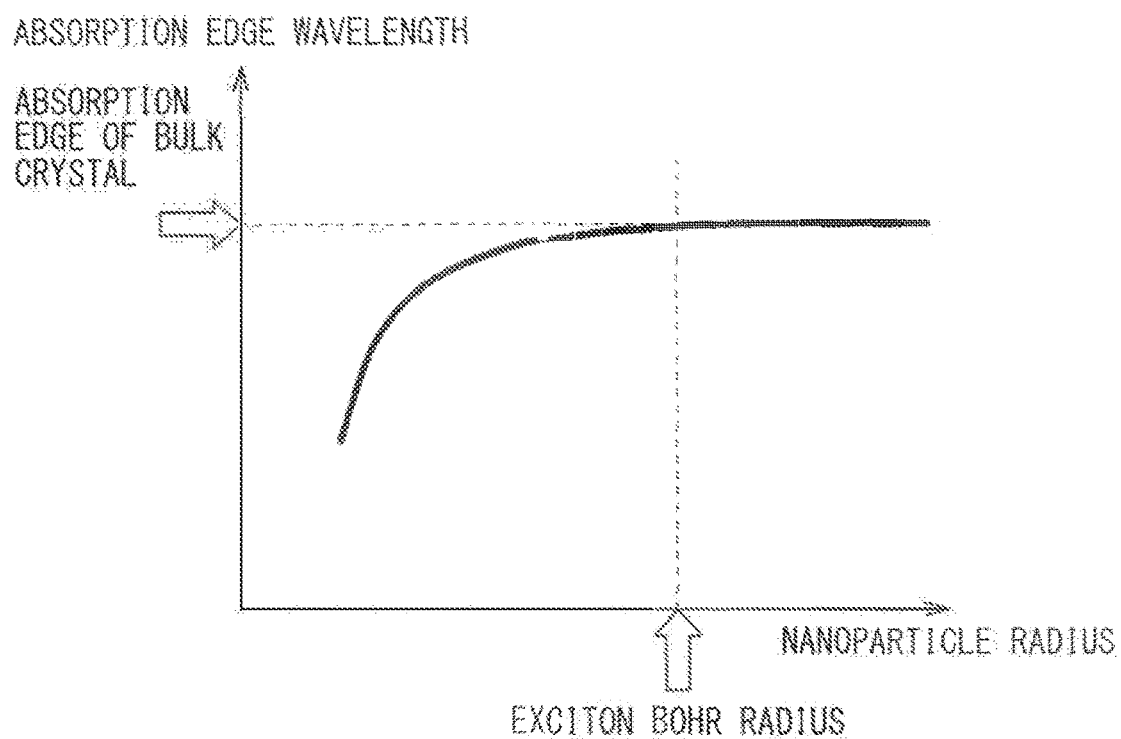

[FIG. 3A]
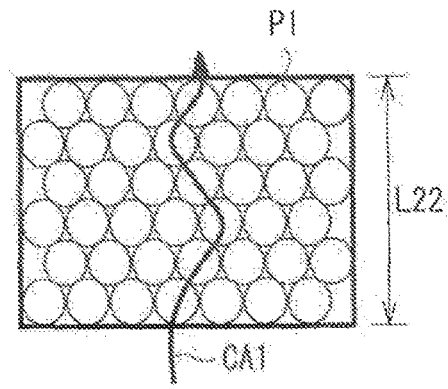
[FIG. 3B]
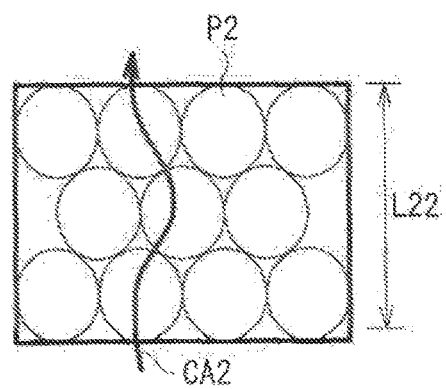
[FIG. 3C]
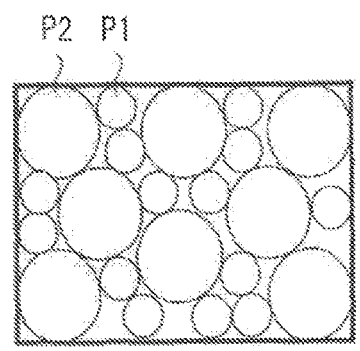
[FIG. 3D]
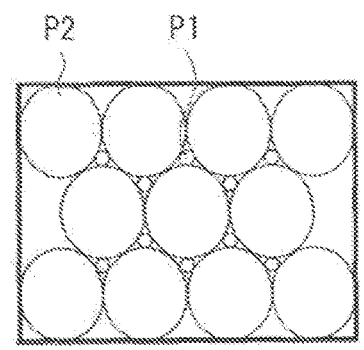

[ FIG. 4 ]
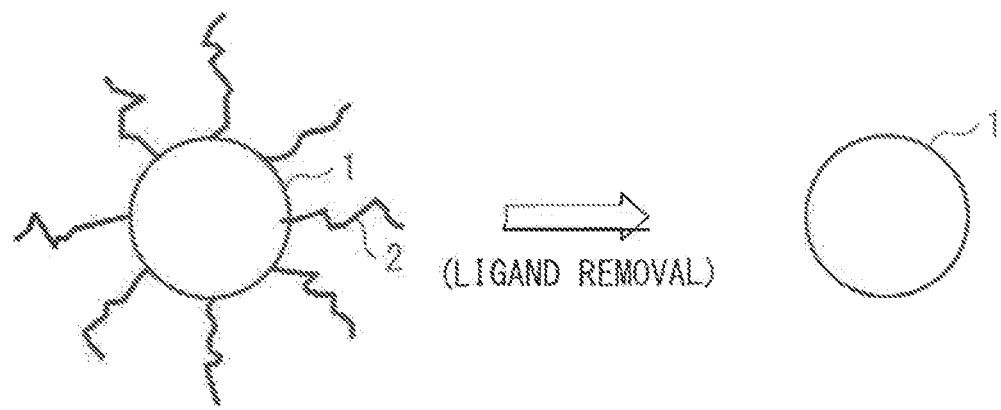
(LIGAND REMOVAL)
[ FIG. 5A ]
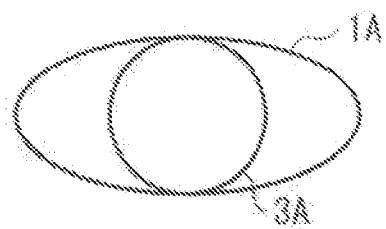
[ FIG. 5B ]
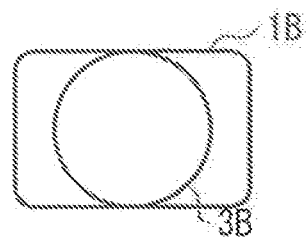
[ FIG. 5C ]
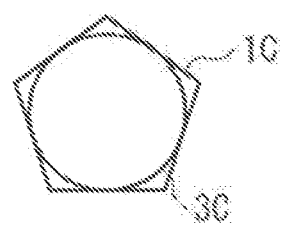

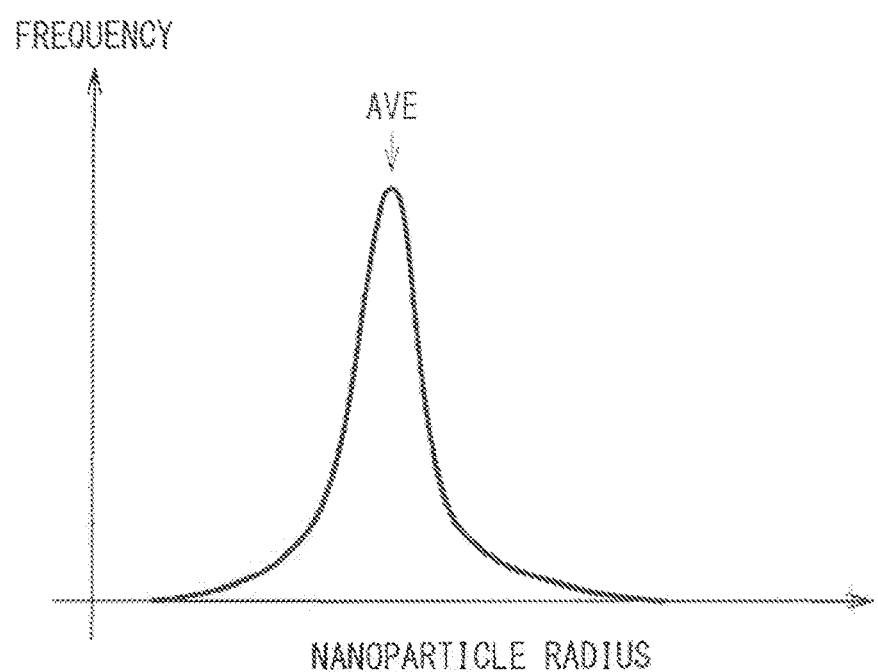

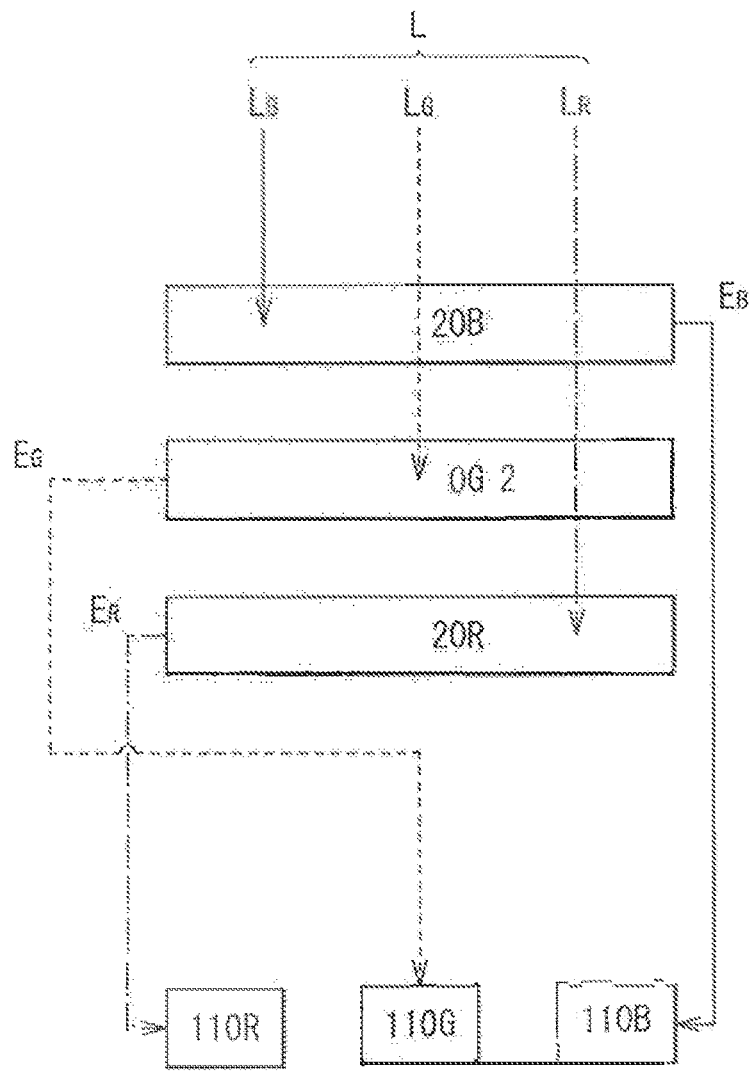
[FIG. 7]

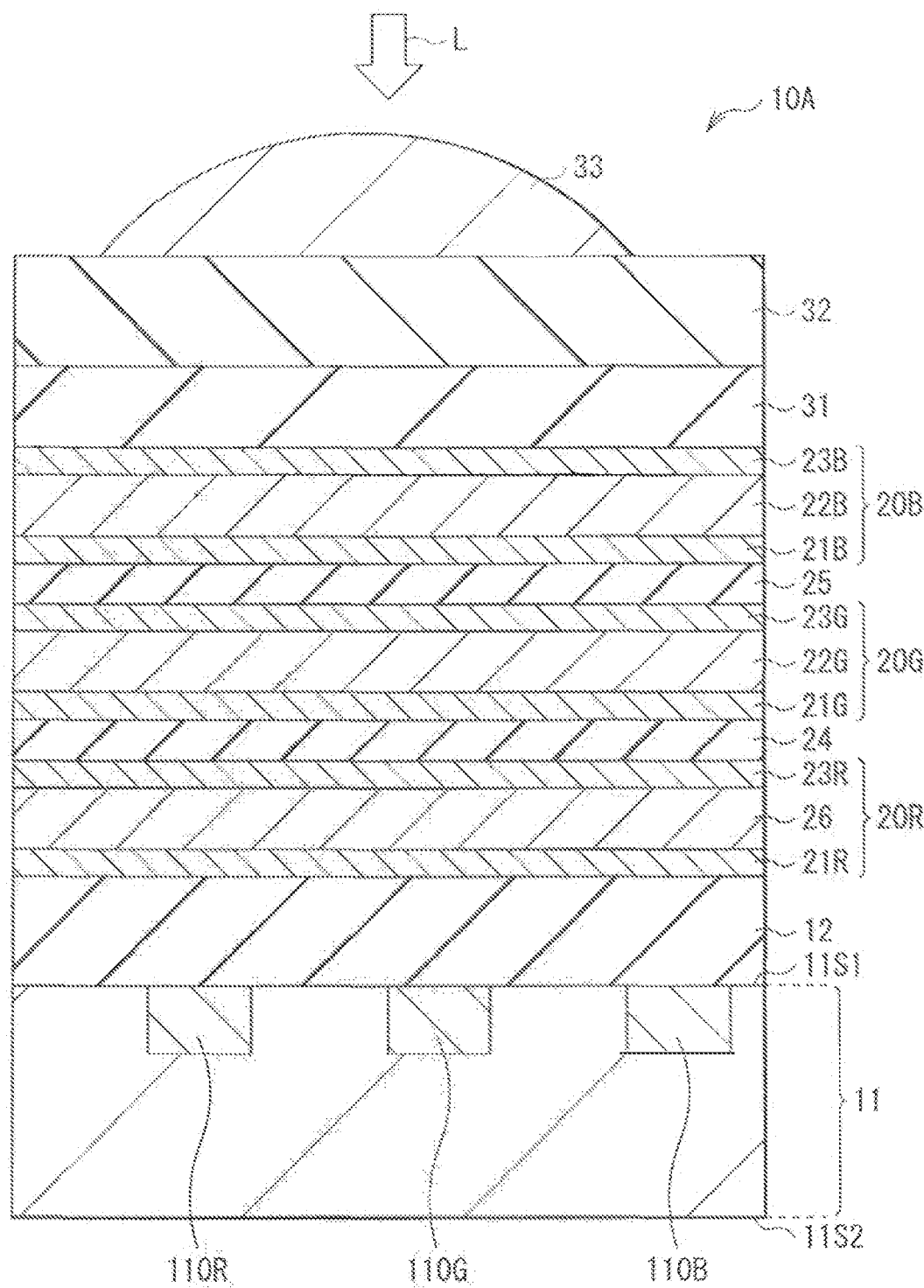
[FIG. 8]

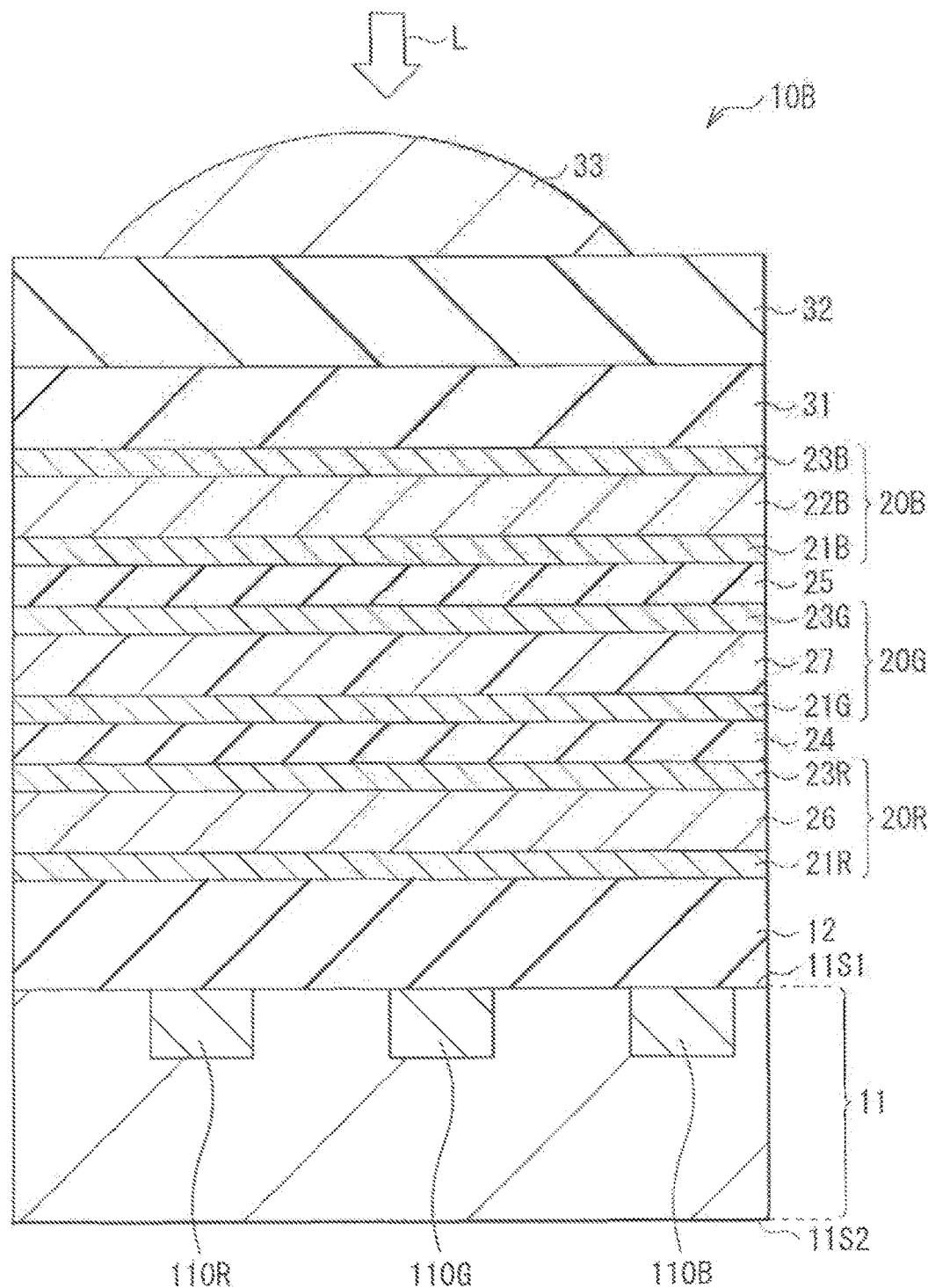
[FIG. 9]

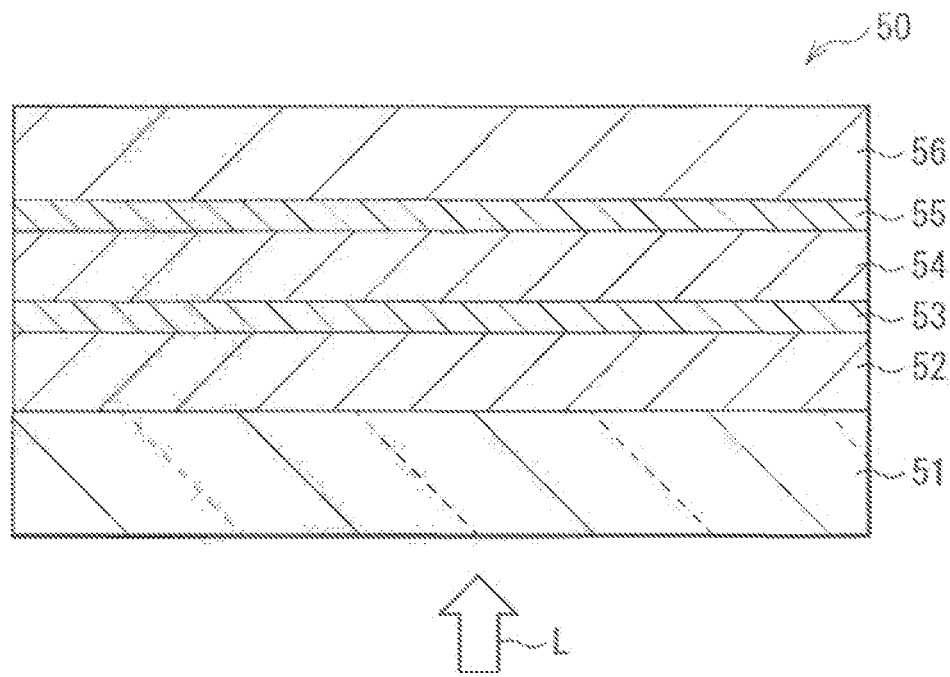
[ FIG. 10 ]

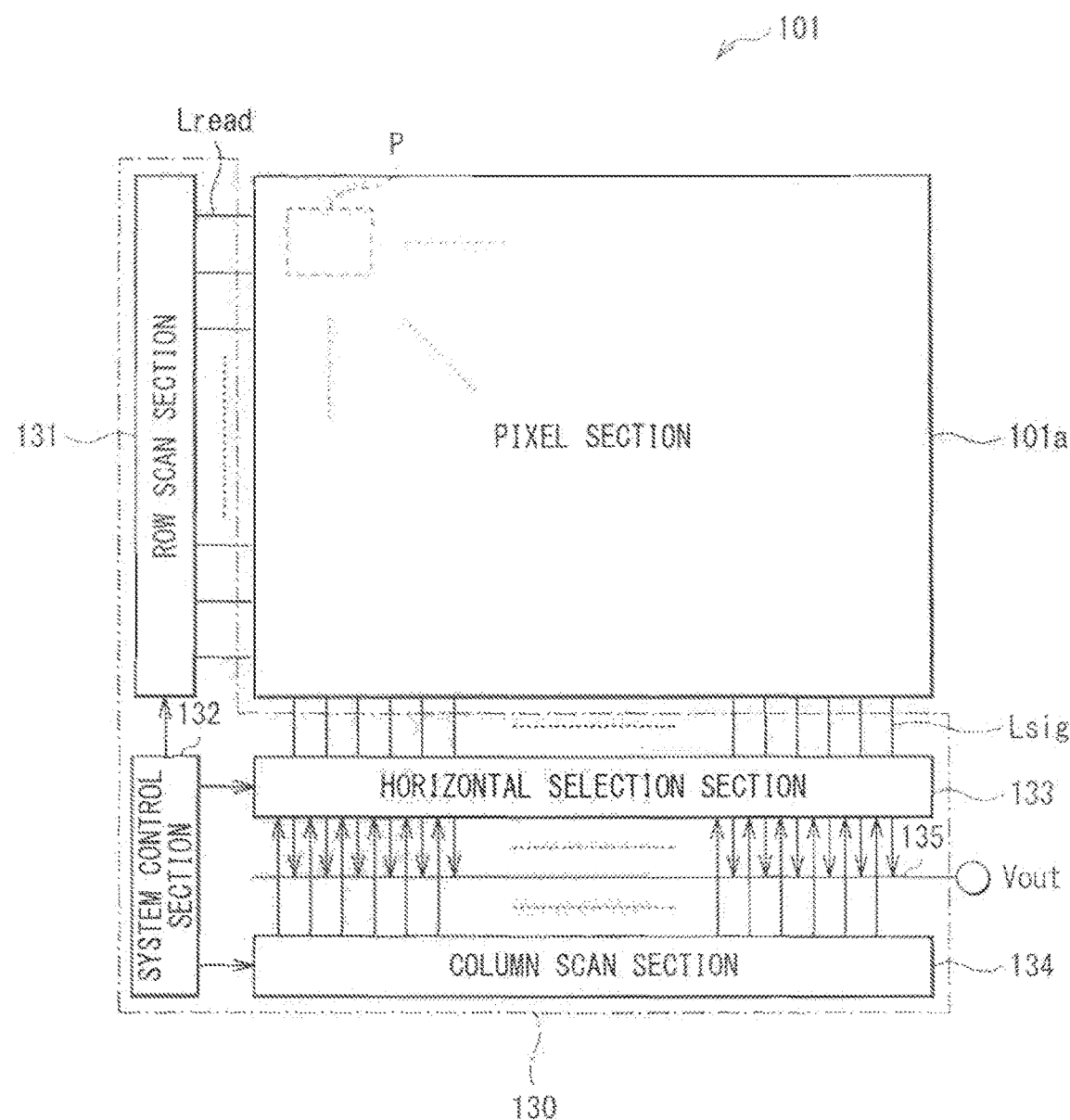
[FIG. 11]

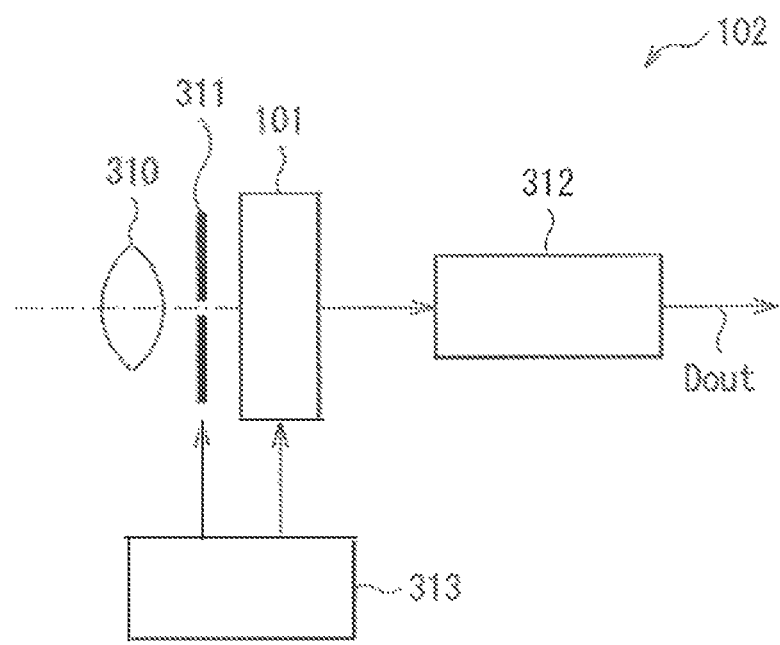
[FIG. 12]

SEMICONDUCTOR NANOPARTICLE DISPERSION, A PHOTOELECTRIC CONVERSION ELEMENT, AND AN IMAGE PICKUP DEVICE FOR SUBSTANTIALLY UNIFORM ABSORPTION EDGE WAVELENGTH

CROSS REFERENCES TO RELATED APPLICATIONS

The present application is a continuation application of U.S. patent application Ser. No. 15/038,216, filed May 20, 2016, which is a National Stage Entry of PCT/JP2014/006291, filed Dec. 17, 2014, and claims the benefit of priority from Japanese Patent Application JP 2013-273094 filed Dec. 27, 2013, the entire contents of which are incorporated herein by reference.

TECHNICAL FIELD

The present disclosure relates to a photoelectric conversion element having a photoelectric conversion layer that contains semiconductor nanoparticles, an image pickup device including the photoelectric conversion element as a pixel, and a semiconductor nanoparticle dispersion that is used for formation of the photoelectric conversion layer.

BACKGROUND ART

As a solid-state image pickup device such as a charge coupled device (CCD) image sensor and a complementary metal oxide semiconductor (CMOS) image sensor, a single-chip CCD color solid-state image pickup device that performs color separation with use of color filters is known. The single-chip CCD color solid-state image pickup device is configured in such a manner that a color filter of any one of a plurality of colors (for example, R, G, and B) is provided for each pixel, and a photoelectric conversion layer is provided in common, for example. Therefore, each pixel receives light of only one color. Accordingly, light usage efficiency is low and the resolution of color images is also low. In addition, since each color light of R, G, and B is detected at positions different from one another in a plane, false color is easily generated. Therefore, optical low-pass filters are necessary. Further, the low-pass filters may cause optical loss.

In contrast, a solid-state image pickup device in which a plurality of photoelectric conversion layers absorbing colors different from one another (for example, R, G, and B) are stacked in one pixel, and signals of three colors are obtained from one pixel has been proposed (for example, PTL 1). In the solid-state image pickup device in PTL 1, each of the photoelectric conversion layers is formed of semiconductor nanoparticles covered with an insulating film, and band gap control with use of quantum confinement effect of the semiconductor nanoparticles is performed. Such a stacked-type solid-state image pickup device provides high color separation performance, high quantum efficiency, and high sensitivity.

Incidentally, a technology relating thereto, a solid-state image pickup device provided with a photoelectric conversion layer in which quantum dots of narrow gap semiconductor are disposed in a conductive film has been also proposed (for example, PTL 2). Further, in PTL 3, a color sensor including photoelectronic material in which semiconductor ultrafine particles are disposed in a transparent medium has been proposed.

CITATION LIST

Patent Literature

[PTL 1] JP 2006-245285
[PTL 2] JP 2010-177392
[PTL 3] JP H10-160574

SUMMARY

Technical Problem

In the above-described PTLs 1 to 3, when color separation using the quantum confinement effect of the semiconductor nanoparticles is performed, size of a particle diameter of the semiconductor nanoparticle is used to extract light in a desired wavelength range. However, it is difficult to reduce variation of the particle diameter. Therefore, certain variation occurs in absorption characteristics of each of the photoelectric conversion layers, and as a result, desired spectral characteristics may not be obtained.

It is desirable to provide a photoelectric conversion element having excellent spectral characteristics, an image pickup device including the photoelectric conversion element as a pixel, and a semiconductor nanoparticle dispersion used for formation of the photoelectric conversion element.

Solution to Problem

According to an embodiment of the disclosure, there is provided a semiconductor nanoparticle dispersion including: a plurality of semiconductor nanoparticles having a radius equal to or larger than an exciton Bohr radius; and a solvent dispersed with the plurality of semiconductor nanoparticles.

Since the semiconductor nanoparticle dispersion according to the embodiment of the disclosure includes the plurality of semiconductor nanoparticles dispersed in the solvent, it is suitable for formation of uniform semiconductor nanoparticle layer by an applying method, for example. The semiconductor nanoparticle layer may be used as, for example, a photoelectric conversion layer. In this case, the plurality of semiconductor nanoparticles have the radius equal to or larger than the exciton Bohr radius. Therefore, quantum confinement effect is not exerted.

According to an embodiment of the disclosure, there is provided a photoelectric conversion element including: a photoelectric conversion layer that contains a plurality of semiconductor nanoparticles having a radius equal to or larger than an exciton Bohr radius; and a pair of electrodes opposing to each other with the photoelectric conversion layer in between. Moreover, according to an embodiment of the disclosure, there is provided an image pickup device provided with a plurality of photoelectric conversion elements as pixels. The photoelectric conversion elements include: a photoelectric conversion layer that contains a plurality of semiconductor nanoparticles having a radius equal to or larger than an exciton Bohr radius; and a pair of electrodes opposing to each other with the photoelectric conversion layer in between.

In the photoelectric conversion element and the image pickup device according to the respective embodiments of the disclosure, the plurality of semiconductor nanoparticles configuring the photoelectric conversion layer each have the radius equal to or larger than the exciton Bohr radius. Therefore, the quantum confinement effect is not exerted. Accordingly, band gap inherent in the semiconductor configuring the semiconductor nanoparticles is obtained. Consequently, variation in absorption edge wavelength caused by the quantum confinement effect that is exerted when the semiconductor nanoparticle has the radius smaller than the exciton Bohr radius is avoided.

Advantageous Effects of Invention

According to the photoelectric conversion element and the image pickup device according to the respective embodiments of the disclosure, the photoelectric conversion layer in which the quantum confinement effect is not exerted is included. Therefore, variation in light absorption characteristics associated with variation of the particle diameter of the semiconductor nanoparticles included in the photoelectric conversion layer is allowed to be avoided. Accordingly, excellent spectral characteristics are exerted and high color reproducibility is expected. Moreover, the semiconductor nanoparticle dispersion according to the embodiment of the disclosure is suitably used for formation of the above-described photoelectric conversion layer. Incidentally, the effects of the disclosure are not limited thereto, and any of effects described below may be obtained.

It is to be understood that both the foregoing general description and the following detailed description are exemplary, and are provided to provide further explanation of the technology as claimed.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

FIG. 1 is a sectional diagram illustrating a schematic structure example of a photoelectric conversion element (a pixel) according to a first embodiment of the disclosure.

FIG. 2 is an explanatory diagram schematically illustrating relationship between an exciton Bohr radius and an absorption edge wavelength in a nanoparticle layer illustrated in FIG. 1.

FIG. 3A is a first schematic diagram illustrating a filling example of semiconductor nanoparticles and a carrier path in the nanoparticle layer.

FIG. 3B is a second schematic diagram illustrating a filling example of semiconductor nanoparticles and a carrier path in the nanoparticle layer.

FIG. 3C is a third schematic diagram illustrating a filling example of semiconductor nanoparticles in the nanoparticle layer.

FIG. 3D is a fourth schematic diagram illustrating a filling example of semiconductor nanoparticles in the nanoparticle layer.

FIG. 4 is a schematic diagram illustrating a state where organic ligand is removed from the semiconductor nanoparticle.

FIG. 5A is a first explanatory diagram for explaining a method of defining a radius of the semiconductor nanoparticle.

FIG. 5B is a second explanatory diagram for explaining the method of defining the radius of the semiconductor nanoparticle.

FIG. 5C is a third explanatory diagram for explaining the method of defining the radius of the semiconductor nanoparticle.

FIG. 6 is an explanatory diagram for explaining distribution of the radiuses of the semiconductor nanoparticles (particle size distribution).

FIG. 7 is an explanatory diagram for explaining operation of the photoelectric conversion element illustrated in FIG. 1.

FIG. 8 is a sectional diagram illustrating a first modification (modification 1) of the photoelectric conversion element illustrated in FIG. 1.

FIG. 9 is a sectional diagram illustrating a second modification (modification 2) of the photoelectric conversion element illustrated in FIG. 1.

FIG. 10 is a sectional diagram illustrating a structure of a main part of a photoelectric conversion element according to a second embodiment of the disclosure.

FIG. 11 is a functional block diagram of an image pickup device.

FIG. 12 is a functional block diagram of an electronic apparatus according to an application example.

DESCRIPTION OF EMBODIMENTS

Hereinafter, some embodiments of the disclosure will be described in detail with reference to drawings. Note that description will be given in the following order.
1. First embodiment (an example of a photoelectric conversion element including a stacked body that includes a plurality of inorganic semiconductor nanoparticle layers (R, G, and B) on a semiconductor substrate)
2. Modification 1 of first embodiment (an example of a photoelectric conversion element including a stacked body that includes an inorganic semiconductor crystal layer and an inorganic semiconductor nanoparticle layer)
3. Modification 2 of first embodiment (an example of a photoelectric conversion element including a stacked body that includes an inorganic semiconductor crystal layer, an organic semiconductor layer, and an inorganic semiconductor nanoparticle layer)
4. Second embodiment (an example of a photoelectric conversion element having a common inorganic semiconductor nanoparticle layer and color filters with different colors by pixels on a transparent substrate)
5. Overall configuration example of image pickup device
6. Application example (an example of an electronic apparatus (a camera))

First Embodiment

Structure of Photoelectric Conversion Element 10

FIG. 1 illustrates a schematic cross-sectional structure of a photoelectric conversion element 10 according to a first embodiment of the disclosure. The photoelectric conversion element 10 may be suitably used for solid-state image pickup devices such as charge coupled device (CCD) and complementary metal oxide semiconductor (CMOS) image sensor. Note that detail of the solid-state image pickup devices will be described later.

For example, the photoelectric conversion element 10 may have a structure in which a plurality of photoelectric conversion sections are stacked in a thickness direction. The plurality of photoelectric conversion sections each selectively detect light with wavelengths different from one another to perform photoelectric conversion. Specifically, for example, the photoelectric conversion element 10 may have a stacked structure in which a red photoelectric conversion section 20R, an insulating layer 24, a green photoelectric conversion section 20G, an insulating layer 25, a blue photoelectric conversion section 20B, a protective layer 31, and a planarizing layer 32 are stacked in order on a semiconductor substrate 11. An on-chip lens 33 is provided on the planarizing layer 32. Since the photoelectric conversion element 10 includes the red photoelectric conversion section 20R, the green photoelectric conversion section 20G, and the blue photoelectric conversion section 20B as described above, color signals of red (R), green (G), and blue (B) are obtained. Therefore, in the case where the photoelectric conversion element 10 is mounted on an image pickup device 101 (FIG. 11) described later, a plurality of kinds of color signals are obtainable by one pixel without use of color filters.

For example, the semiconductor substrate 11 may have a red storage layer 110R, a green storage layer 110G, and a blue storage layer 110B that may be embedded in predetermined regions of a p-type silicon (Si) substrate 110. The red storage layer 110R, the green storage layer 110G, and the blue storage layer 110B each include an n-type semiconductor region. Signal charges (electrons in the present embodiment) that are supplied from the red photoelectric conversion section 20R, the green photoelectric conversion section 20G, and the blue photoelectric conversion section 20G are stored in the respective n-type semiconductor regions. The n-type semiconductor region of each of the red storage layer 110R, the green storage layer 110G, and the blue storage layer 110B may be formed in such a manner that an n-type impurity such as phosphorous (P) and arsenic (As) is doped in the semiconductor substrate 11.

A conductive plug (not illustrated) that is to be a transmission path of charges from a photoelectric conversion section 11G, namely, electrons or holes may be embedded in the semiconductor substrate 11. In the first embodiment, a rear surface (a surface 11S1) of the semiconductor substrate 11 is a light receiving surface. A plurality of pixel transistors corresponding to the red photoelectric conversion section 20R, the green photoelectric conversion section 20G, and the blue photoelectric conversion section 20B and a circuit forming layer in which a peripheral circuit configured of a logic circuit and the like are provided on a front surface (a surface 11S2) side of the semiconductor substrate 11 (those are not illustrated).

Examples of the pixel transistor may include, for example, a transfer transistor, a reset transistor, an amplification transistor, and a selection transistor. The pixel transistors may be each configured of, for example, an MOS transistor, and are formed on a p-type semiconductor well region on the surface 11S2 side. A circuit including such pixel transistors is formed for each of red, green, and blue photoelectric conversion sections. Each circuit may have a three transistor configuration including a total of three transistors that includes, for example, the transfer transistor, the reset transistor, and the amplification transistor out of these pixel transistors, or may have a four transistor configuration added with the selection transistor. The transfer transistor transfers, to vertical signal lines Lsig described later (see FIG. 11), signal charges (electrons in the first embodiment) corresponding to each color, that have been generated in each of the red photoelectric conversion section 20R, the green photoelectric conversion section 20G, and the blue photoelectric conversion section 20B and respectively stored in the red storage layer 110R, the green storage layer 110G, and the blue storage layer 110B.

An insulating layer 12 on the semiconductor substrate 11 may be formed of, for example, silicon oxide ($SiO_2$), silicon nitride (SiN), silicon oxynitride (SiON), or hafnium oxide ($HfO_2$). The insulating layer 12 may be configured by stacking a plurality of kinds of insulating films. Moreover, the insulating layer 12 may be formed on an organic insulating material. A plug and an electrode (both not illustrated) that connect the red storage layer 110R with the red photoelectric conversion section 20R are provided in the insulating layer 12. Likewise, a plug and an electrode that connect the green storage layer 110G with the green photoelectric conversion section 20G, and a plug and an electrode that connect the blue storage layer 110B and the blue photoelectric conversion section 20B are also provided in the insulating layer 12.

The red photoelectric conversion section 20R is configured by stacking a first electrode 21R, a semiconductor nanoparticle layer (hereinafter, simply referred to as a nanoparticle layer) 22R, and a second electrode 23R in order on the insulating layer 12. In the red photoelectric conversion section 20R, light of red color (for example, wavelength of 600 nm to 750 nm) is selectively absorbed, and then electron-hole pairs are generated. The green photoelectric conversion section 20G is configured by stacking a first electrode 21G, a nanoparticle layer 22G, and a second electrode 23G in order on the insulating layer 24. In the green photoelectric conversion section 20G, light of green color (for example, wavelength of 500 nm to 650 nm) is selectively absorbed, and then electron-hole pairs are generated. The blue photoelectric conversion section 20B is configured by stacking a first electrode 21B, a nanoparticle layer 22B, and a second electrode 23B in order on the insulating layer 25. In the blue photoelectric conversion section 20B, light of blue color (for example, wavelength of 400 nm to 550 nm) is selectively absorbed, and then electron-hole pairs are generated.

The first electrodes 21R, 21G, and 21B are electrically connected to the above-described conductive plug embedded in the semiconductor substrate 11. On the other hand, the second electrodes 23R, 23G, and 23B may be connected to a wiring in the above-described circuit formation layer that may be provided on the surface 11S2 of the semiconductor substrate 11 through contact sections (not illustrated), in a peripheral region of the solid-state image pickup device, for example. As a result, the charges (in this case, holes) are discharged.

Each of the nanoparticle layers 22R, 22G, and 22B is a colloidal nanoparticle layer that substantially contains a plurality of semiconductor nanoparticles each having a radius equal to or larger than the exciton Bohr radius, and may have a thickness of, for example, about 500 nm to 2000 nm. The nanoparticle layers 22R, 22G, and 22B are photoelectric conversion layers that absorb light with selective wavelength, namely, red light, green light, and blue light, respectively, to generate the electron-hole pairs. Semiconductor nanoparticles 22RP, 22GP, and 22BP each have a radius equal to or larger than an exciton Bohr radius inherent in a substance. Therefore, quantum confinement effect is not exerted, and variation of band gap due to quantum effect does not occur. Accordingly, as illustrated in FIG. 2, when the radius of the semiconductor nanoparticle is equal to or larger than an exciton Bohr radius, spectral characteristics similar to that of the bulk crystal is obtainable even by the colloidal nanoparticle layer. Note that, in FIG. 2, the horizontal axis indicates the radius of the semiconductor nanoparticle, and the vertical axis indicates an absorption edge wavelength of the nanoparticle layer using the same.

The semiconductor nanoparticle may be formed of, for example, $TiO_2$, ZnO, $WO_3$, NiO, $MoO_3$, CuO, $Ga_2O_3$, $SrTiO_3$, $SnO_2$, InSnOx, $Nb_2O_3$, $CiO_2$, $MnO_2$, $V_2O_3$, CrO, $CuInSe_2$, $CuInS_2$, $AgInS_2$, Si, PbS, PbSe, PbTe, CdS, CdSe, CdTe, GaAs, AlGaAs, GaP, InP, AlGaInP, InAs, Ge, $In_2S_3$, $Bi_2S_3$, ZnSe, ZnTe, ZnS, GaN, GaInN, InSb, InAs, or InN, and is synthesized in an organic solvent through chemical reaction. In synthesis, ligand is used to facilitate particle diameter control. The ligand is formed of an absorbing group that affects relative action on a surface of the semiconductor nanoparticle, and an alkyl chain coupled therewith. The number of carbons of the alkyl chain may be, for example, 2 to 50, and the absorbing group may be, for example, amine, phosphone, phosphine, carboxyl, hydroxyl, or thiol. In the case where, among the above-described materials, a nanoparticle (equivalent to bulk semiconductor) that is formed of ternary GaInN and has a radius larger than the exciton Bohr radius is used, the blue light is absorbed when the mixed crystal ratio In/(Ga+In) is equal to or higher than 0.07. In addition, when the nanoparticle formed of chalcopyrite-based semiconductor is used, the blue light with the wavelength of near 464 nm is absorbed in the case of $CuAlSe_2$, and the blue light with the wavelength of near 454 nm is absorbed in the case of $AgGaS_2$. However, the semiconductor nanoparticle may be preferably formed of a binary semiconductor material formed of two kinds of elements, namely, binary mixed crystal semiconductor material because the absorption edge wavelength is easily controlled as compared with a ternary semiconductor material. For example, binary semiconductor material absorbing the blue light may correspond to zinc selenide compound (ZnSe), and the binary semiconductor material absorbing the green light may correspond to zinc telluride compound (ZnTe). In addition, material doped with impurity element may be used for the semiconductor nanoparticles in some cases. For example, it may be sufficient that ZnSe and ZnTe are doped with gallium (Ga) as an n-type dopant at a concentration of $1e+18$ $cm^{-3}$ and are doped with nitrogen (N) as a p-type dopant at a concentration of $1e+18$ $cm^{-3}$.

Exciton Bohr radiuses of typical semiconductor nanoparticles are illustrated in Table 1. In this case, the exciton Bohr radiuses illustrated in Table 1 are calculated from electron effective mass, hole effective mass, and specific dielectric constant (reference: "Semiconductor Physics", Nobuo Mikoshiba). Note that Source 1 in Table 1 is "Specific Dielectric Constant ($\varepsilon$)", Sermage, B., Voss, M.: Phys. Rev. B 15 (1977) 3935. Source 2 is "Electron Effective Mass", Sondergled, M.: Phys. Status. Solidi (b) 81 (1977) 253. Source 3 is "Hole Effective Mass", Berlincourt, D., Jaffe, H., Shiozawa, L. R.: Phys. Rev. 129 (1963) 1009. Source 4 is "Lead Salt Quantum Dots: the Limit of Strong Quantum Confinement", Acc. Chem. Res. 2000, 33, 773-780. Source 5 is "SEMICONDUCTOR PHYSICS (2nd edition)", Sze, S. M. Source 6 is "Defect Evaluation Technique of Semiconductor Material" supervised by Toshiaki Ikoma, Fumio Hasegawa. Source 7 is "Specific Dielectric Constant ($\varepsilon$)", Berlincourt, D., Jaffe, H., Shiozawa, L. R.: Phys. Rev. 129 (1963) 1009. Source 8 is "Electron Effective Mass", Smith, F. T. J.: J. Appl. Phys. 45 (1974) 567. Source 9 is "Hole Effective Mass", Aven, M., Segall, B.: Phys. Rev. 131 (1963) 98. In addition, in Table 1, energy gap Eg [eV] and absorption edge wavelength lambda [nm] in a nanoparticle layer that contains semiconductor nanoparticles each having a radius equal to or larger than an exciton Bohr radius are illustrated together. As the semiconductor nanoparticle, a substance allowing a predetermined absorption edge wavelength lambda to be obtained is selected and used as appropriate.

TABLE 1

| No. | Semiconductor | Eg (eV) | λ (nm) | Exciton Bohr Radius (nm) | Source |
|---|---|---|---|---|---|
| 1 | ZnSe | 2.72 | 456 | 3.9 | 1, 2, 3 |
| 2 | PbSe | 0.27 | 4593 | 46 | 4 |
| 3 | PbS | 0.41 | 3024 | 7.2 | 5 |
| 4 | PbTe | 0.31 | 4000 | 17.3 | 5 |
| 5 | CdSe | 1.74 | 713 | 5.6 | 6 |
| 6 | CdTe | 1.52 | 816 | 6.5 | 6 |
| 7 | CdS | 2.38 | 521 | 3.1 | 6 |
| 8 | InSb | 0.18 | 6889 | 71.7 | 6 |
| 9 | InAs | 0.356 | 3483 | 35.4 | 6 |
| 10 | GaAs | 1.428 | 868 | 12.0 | 6 |
| 11 | GaN | 3.36 | 369 | 4.5 | 5 |
| 12 | ZnTe | 2.26 | 549 | 5.4 | 7, 8, 9 |

Moreover, the radius of the semiconductor nanoparticle may be desirably equal to or smaller than one-twentieth of the absorption peak wavelength of each of the nanoparticle layers 22R, 22G, and 22B. When the semiconductor nanoparticle has such a radius, Rayleigh scattering is dominant to scattering of incident light in each of the nanoparticle layers. Therefore, it is possible to suppress crosstalk that is generated when scattered light of the incident light enters a light receiving section of a peripheral device (for example, adjacent pixels). Accordingly, for example, when blue spectroscopy is performed using ZnSe as the semiconductor nanoparticles, the radius thereof may be preferably 3.9 nm or more and 22.5 nm or less.

Moreover, each of the nanoparticle layers 22R, 22G, and 22B may be preferably formed of not semiconductor nanoparticles with a certain radius but a plurality of kinds of semiconductor nanoparticles with different radiuses from one another. This is to achieve both of improvement in light absorptivity and improvement in conductivity in each of the nanoparticle layers 22R, 22G, and 22B. FIG. 3A is a diagram schematically illustrates a case where each of the nanoparticle layers 22R, 22G, and 22B is formed of only semiconductor nanoparticles (first particles P1) each having a relatively small radius substantially same as the exciton Bohr radius, for example. In this case, for example, it may be considered that carriers move inside the nanoparticle layers 22R, 22G, and 22R through a path CA1. On the other hand, FIG. 3B is a diagram schematically illustrates a case where each of the nanoparticle layers 22R, 22G, and 22B is formed of only semiconductor nanoparticles (second particles P2) each having a radius larger than that of the first particle P1. In this case, for example, it may be considered that the carriers move inside the nanoparticle layers 22R, 22G, and 22B through a path CA2. Here, when FIG. 3A and FIG. 3B are compared, higher carrier mobility is obtained in the case illustrated in FIG. 3B. This is because the characteristics of the ligand whose carrier mobility is lower than that of the nanoparticle is dominant to the carrier mobility of the colloidal nanoparticle layer itself, and the number of times the carriers pass through the ligand at the time when the carriers move between the nanoparticles is decreased as the radius of the semiconductor nanoparticle is larger. Specifically, in FIG. 3A, the carriers pass through seven semiconductor nanoparticles (first particles P1) when the carriers move a distance L22 through the path CA1. In contrast, in FIG. 3B, it is only necessary for the carriers to pass through three semiconductor nanoparticles (second nanoparticles P2) when the carriers move the distance L22 through the path CA2. However, when the radius of the semiconductor nanoparticle is large, a volume of a clearance between the semiconductor nanoparticles is also increased. Accordingly, the light absorptivity of each of the nanoparticle layers 22R, 22G, and 22B is deteriorated. Therefore, as illustrated in FIG. 3C, the first particles P1 and the second particles P2 that are different in size from each other are mixed, which makes it possible to fill the clearance between the second particles P2 with the first particles P1 to improve absorbance while ensuring low-resistance path line by the second particles P2. To further enhance the absorbance, for example, as illustrated in FIG. 3D, the radius of the first particle P1 may be preferably 0.16 times as large as the radius of the second particle P2. In this case, the clearance between the close-packed second particles P2 is efficiently filled with the first particles P1, and thus the volume of the nanoparticles are increased by 1.7% as compared with the case of only the second particles P2. As an example, more specifically described about nanoparticles formed of ZnSe, it is sufficient that the radius of the second particle P2 is made to be 26 nm, and the radius of the first particle P1 is made to be 4 nm. Both radiuses are larger than the exciton Bohr radius of 3.9 nm, which makes it possible to obtain favorable spectral characteristics.

The radius of the semiconductor nanoparticle described here may be obtained in the following manner, for example. First, for example, as illustrated in FIG. 4, in an inert gas atmosphere, annealing may be performed at a temperature at which the semiconductor nanoparticle 1 does not fuse and melt, and organic ligand 2 on the surface of the semiconductor nanoparticle 1 may be removed. Although necessary annealing temperature is varied depending on the kind of the semiconductor nanoparticles 1 and the organic ligand 2, for example, it may be about 350° C. when the semiconductor nanoparticle 1 is CdSe and the organic ligand 2 is octadecylamine (ODAm).

Then, a particle image is examined with use of a scanning electron microscope (SEM) or a transmission electron microscope (TEM) (lattice image is most preferable), and particle size distribution is measured. For example, SEM can be utilized to measure the particle size distribution based on a measured area of 100 nm×100 nm from which an average radius of the semiconductor nanoparticle can be further determined. For example, as illustrated in FIGS. 5A to 5C, the radius of the semiconductor nanoparticle may be defined as a radius of a largest sphere 3 (3A to 3C) that is inscribed inside the semiconductor nanoparticle 1 (1A to 1C). The radius thus defined may exhibit distribution illustrated in FIG. 6, for example. When an average AVE of the radiuses of the sphere 3 (3A to 3C) at a peak position of the distribution illustrated in FIG. 6 is a value equal to or larger than the exciton Bohr radius of the substance, substantially constant absorption edge wavelength is obtainable irrespective of the particle size distribution.

The first electrodes 21R, 21G, and 21B may be provided for each pixel, for example. Each of the first electrodes 21R, 21G, and 21B may be formed of, for example, a light transmissive conductive material, specifically, indium tin oxide (ITO). Each of the first electrodes 21R, 21G, and 21B may be formed of, for example, a tin oxide ($SnO_2$) based material or a zinc oxide (ZnO) based material. The tin oxide based material is tin oxide added with a dopant, and the zinc oxide based material may be aluminum zinc oxide (AZO) that is obtained by adding aluminum (Al) as a dopant to zinc oxide, gallium zinc oxide (GZO) that is obtained by adding gallium (Ga) as a dopant to zinc oxide, indium zinc oxide (IZO) that is obtained by adding indium (In) as a dopant to zinc oxide, or the like. In addition, IGZO, CuI, $InSbO_4$, $ZnMgO$, $CuInO_2$, $MgIn_2O_4$, CdO, $ZnSnO_3$, or the like may be used. The thickness of each of the first electrodes 21R, 21G, and 21B may be, for example, about 5 nm to about 300 nm both inclusive.

For example, a hole transport layer (not illustrated) may be provided between the nanoparticle layer 22R and the second electrode 23R, between the nanoparticle layer 22G and the second electrode 23G, and between the nanoparticle layer 22B and the second electrode 23B. The hole transport layer has a function of facilitating supply of the holes that are generated in the nanoparticle layers 22R, 22G, and 22B, to the second electrodes 23R, 23G, and 23B, respectively, and may be formed of, for example, molybdenum oxide or nickel oxide. The hole transport layer may be formed by stacking molybdenum oxide and nickel oxide.

The second electrodes 23R, 23G, and 23B are to extract the holes generated in the nanoparticle layers 22R, 22G, and 22B, respectively. The holes extracted from the second electrodes 23R, 23G, and 23B may be discharged to, for example, p-type semiconductor regions in the semiconductor substrate 11 through the transmission paths (not illustrated). Similar to the first electrodes 21R, 21G, and 21B, the second electrodes 23R, 23G, and 23B are each formed of a transparent conductive material. In the photoelectric conversion element 10, since the holes extracted from the second electrodes 23R, 23G, and 23B are discharged, when the plurality of photoelectric conversion elements 10 are arranged (for example, an image pickup device 101 in FIG. 11 described later), the second electrodes 23R, 23G, and 23B may be provided so as to be common to the respective photoelectric conversion elements 10 (pixels P in FIG. 11). The thickness of each of the second electrodes 23R, 23G, and 23B may be, for example, about 5 nm to about 300 nm both inclusive.

The insulating layers 24 and 25 may be each configured of a single layer film formed of one of silicon oxide ($SiO_2$), silicon nitride (SiN), and silicon oxynitride (SiON), or a stacked layer film formed of two or more thereof.

The protective layer 31 covering the second electrode 23B is to prevent infiltration of moisture and the like to the red photoelectric conversion section 20R, the green photoelectric conversion section 20G, and the blue photoelectric conversion section 20B. The protective layer 31 is formed of a material having optical transparency. For example, a single layer film of silicon nitride, silicon oxide, silicon oxynitride, or the like, or a stacked layer film thereof may be used for such a protective layer 31.

The on-chip lens 33 is provided on the protective layer 31 with the planarizing layer 32 in between. Acrylic resin materials, styrene resin materials, epoxy resin materials, or the like may be used for the planarizing layer 32. The planarizing layer 32 may be provided as necessary, and the protective layer 31 may double as the planarizing layer 32. The on-chip lens 33 is to collect light that has entered from above, on the light receiving surface of each of the red photoelectric conversion section 20R, the green photoelectric conversion section 20G, and the blue photoelectric conversion section 20B.

Method of Manufacturing Photoelectric Conversion Element 10

Such a photoelectric conversion element 10 may be manufactured in the following manner, for example.

First, the red storage layer 110R, the green storage layer 110G, and the blue storage layer 110B may be formed on the semiconductor substrate 11 through, for example, ion infiltration. At this time, the pixel transistors are also formed on the semiconductor substrate 11. Then, after the electrodes that electrically connect the red storage layer 110R, the green storage layer 110G, and the blue storage layer 110B with the first electrodes 21R, 21G, and 21B, respectively, are formed on the semiconductor substrate 11, an oxide silicon film may be formed by, for example, plasma chemical vapor deposition (CVD) method to form the insulating layer 12. In the insulating layer 12, the plugs reaching the electrodes are provided.

Subsequently, the red photoelectric conversion section 20R, the insulating layer 24, the green photoelectric conversion section 20G, the insulating layer 25, the blue photoelectric conversion section 20B, the protective layer 31, and the planarizing layer 32 are formed by stacking in order on the insulating layer 12. Specifically, first, the first electrode 21R is formed. The first electrode 21R may be formed in such a manner that an ITO film is formed by, for example, a sputtering method, and then the ITO film is patterned by photolithography technique and then is subjected to dry etching or wet etching.

Then, after the electron transport layer formed of, for example, titanium oxide may be provided on the first electrode 21R by the sputtering method or the like as necessary, the nanoparticle layer 22R is formed. For example, the nanoparticle layer 22R may be formed in such a manner that ink in which a plurality of semiconductor nanoparticles are dispersed in a predetermined solvent (semiconductor nanoparticle dispersion) may be applied on the electron transport layer by a spin coating method or the like, and then thermal treatment is performed. For example, the solvent having relatively small dielectric constant and thus having small polarity and having a benzene ring and a polar group in the structure, such as toluene and chloroform may be preferable. For example, the ink to be applied may be fabricated in such a manner that the above-described solvent is added to weighed semiconductor nanoparticles, and the resultant is stirred at 200 rpm with use of a stirring bar for 30 minutes at room temperature. In addition, after the ink is applied, MPA substitution treatment of the ligand may be preferably performed in order to improve adhesiveness between the electron transport layer and the nanoparticle layer 22R. The MPA substitution treatment is performed in the following manner. First, the semiconductor nanoparticles are applied (are subjected to spin coating) by a spin coater (step 1). Then, the semiconductor substrate 11 on which the semiconductor nanoparticles have been applied is immersed in 100 mM of methanol solution of 3-mercaptopropionic acid (MPA) for one minute (step 2). Next, the resultant semiconductor substrate 11 is immersed in methanol solution for 10 seconds (step 3). Then, the resultant semiconductor substrate 11 is immersed in another methanol solution for 10 seconds (step 4). Finally, the entire resultant semiconductor substrate 11 is dried (step 5). The above-described steps 1 to 5 are repeated until the nanoparticle layer 22R having a desired thickness is obtained.

In this case, the nanoparticle layer 22R has a multilayer structure in which a plurality of thin films of the nanoparticles are stacked. The MPA substituent treatment is effective to improve adhesiveness between the thin films configuring the nanoparticle layer 22R. Incidentally, although depending on the semiconductor material to be used, the nanoparticle layer 22R may desirably have a film thickness of about 500 nm or more for sufficient light absorption.

After the formation of the nanoparticle layer 22R, $MoO_3$ (molybdenum oxide) layer as the hole transport layer and Ag (silver) layer as the reflection electrode may be formed by, for example, a vapor deposition method. As the hole transport layer, organic films such as Poly(3,4-ethylenedioxythiophene) (PEDOT) and N,N'-Bis(3-methylphenyl)-N,N'-diphenylbenzidine (TPD) may be used in addition to the semiconductor films such as nickel oxide (NiO) and $V_2O_5$.

Subsequently, a conductive layer may be formed on the hole transport layer by, for example, a vacuum vapor deposition method to obtain the second electrode 23R. As a result, the red photoelectric conversion section 20R is formed. The green photoelectric conversion section 20G and the blue photoelectric conversion section 20B are formed in a manner similar thereto.

After the blue photoelectric conversion section 20B is formed, the protective layer 31 is formed on the second electrode 23B of the blue photoelectric conversion section 20B. The protective layer 31 may be formed in such a manner that after a film of the silicon nitride or silicon oxide is formed by, for example, plasma CVD method, patterning by photolithography technique and dry etching are performed on the film, and finally post-treatment such as ashing and organic cleaning is performed to remove deposited material and residue.

After the protective layer 31 is formed, the planarizing layer 32 and the on-chip lens 33 are formed in order on the protective layer 31. The photoelectric conversion element 10 illustrated in FIG. 1 is completed by the above-described steps.

Operation of Photoelectric Conversion Element 10

In the photoelectric conversion element 10, for example, as the pixels of the image pickup device, the signal charges (electrons) may be obtained in the following manner. When light L enters the photoelectric conversion element 10, the light L passes through the on-chip lens 33, the blue photoelectric conversion section 20B, the green photoelectric conversion section 20G, and the red photoelectric conversion section 20R in order, and the light L is photoelectrically converted for each color light of blue, green, and red in the passage process.

Specifically, in detail, as illustrated in FIG. 7, out of the light L that has entered the photoelectric conversion element 10, blue light $L_B$ is selectively detected (absorbed) by the blue photoelectric conversion section 20B to be photoelectrically converted. Out of the electron-hole pairs that have been generated in the blue photoelectric conversion section 20B, electrons $E_B$ are extracted from the first electrode 21B, and are stored in the blue storage layer 110B. On the other hand, holes are discharged from the second electrode 23B. Likewise, out of the light that has passed through the blue photoelectric conversion section 20B, green light $L_G$ is selectively detected by the green photoelectric conversion section 20G to be photoelectrically converted. Out of the electron-hole pairs that have been generated in the green photoelectric conversion section 20G, electrons $E_G$ are extracted from the first electrode 21G, and are stored in the green storage layer 110G. Out of the light that has passed through the blue photoelectric conversion section 20B and the green photoelectric conversion section 20G, red light $L_R$ is selectively detected by the red photoelectric conversion section 20R to be photoelectrically converted. Out of the electron-hole pairs that have been generated in the red photoelectric conversion section 20R, electrons $E_R$ are extracted from the first electrode 21R, and are stored in the red storage layer 110R.

At the time of the reading operation, the transfer transistors corresponding to the respective colors are turned on, and the electrons $E_R$, $E_G$, and $E_B$ that are stored in the red storage layer 110R, the green storage layer 110G, and the blue storage layer 110B, respectively, are transferred to the vertical signal lines Lsig (see FIG. 11). In this way, the blue photoelectric conversion section 20B, the green photoelectric conversion section 20G, and the red photoelectric conversion section 20R are stacked in order of the light L entering, which makes it possible to detect the color light of red, green, and blue separately and to obtain signal charges for each color without providing color filters.

Function and Effects of Photoelectric Conversion Element 10

In the photoelectric conversion element 10, each of the nanoparticle layers 22R, 22G, and 22B is a colloidal nanoparticle layer that contains the plurality of semiconductor nanoparticles each having a radius equal to or larger than the exciton Bohr radius. Therefore, quantum confinement effect is not exerted in the nanoparticle layers 22R, 22G, and 22B, and band gap inherent in the substance of the semiconductor nanoparticles is obtainable. Accordingly, it is possible to avoid variation of the light absorption characteristics associated with the variation of the particle diameter of the semiconductor nanoparticles contained in the photoelectric conversion layer. As a result, excellent spectral characteristics are exerted and high color reproducibility is expected. In addition, the nanoparticle layers 22R, 22G, and 22B are allowed to be formed in such a manner that the ink in which the semiconductor nanoparticles are dispersed in the predetermined solvent is applied by an applying method such as a spin coating method. A film formed of crystalline nanoparticles is allowed to be obtained relatively easily by the method. Accordingly, degradation in photoelectric conversion efficiency caused by crystal defect that is observed in a film fabricated by gas phase methods such as a sputtering method and a plasma CVD method is avoided.

Moreover, when the radius of the semiconductor nanoparticle is made to be equal to or smaller than one-twentieth of the absorption peak wavelength in each of the nanoparticle layers 22R, 22G, and 22B, it is possible to suppress crosstalk caused by entering of the scattered light of the incident light to the light receiving section of the peripheral devices (for example, adjacent pixels). This is because, with such a radius, Rayleigh scattering is dominant to the scattering of the incident light in each of the nanoparticle layers.

Moreover, when the nanoparticle layers 22R, 22G, and 22B are formed of a plurality of kinds of semiconductor nanoparticles having radiuses different from one another, it is possible to achieve both of improvement in light absorptivity and improvement in conductivity.

In addition, since the inorganic semiconductor is used as the semiconductor nanoparticles, unlike the organic semiconductor, bound state of the excitons is weak and charge separation from the exciton state is easily performed. Therefore, as for the semiconductor nanoparticles, it is considered that diffusion length of the excitons does not affect the device characteristics.

Modification 1

FIG. 8 illustrates a cross sectional structure of a photoelectric conversion element 10A that is a first modification of the above-described photoelectric conversion element 10. In the above-described photoelectric conversion element 10, the semiconductor nanoparticle layer is used as the photoelectric conversion film in all of the red photoelectric conversion section 20R, the green photoelectric conversion section 20G, and the blue photoelectric conversion section 20B; however, the present technology is not limited thereto. As with the photoelectric conversion element 10A illustrated in FIG. 8, for example, a crystal silicon (Si) layer 26 may be used as, for example, a photoelectric conversion film in the red photoelectric conversion section 20R. In this case, the red light is selectively absorbed and photoelectrically converted by the crystal silicon layer 26. Even in this case, effects similar to those by the photoelectric conversion element 10 are obtainable. Note that an inorganic semiconductor crystal other than the crystal silicon may be used. Moreover, since the crystal silicon layer 26 is employed in place of the semiconductor nanoparticle layer 22R in the photoelectric conversion element 10A, the structure of the photoelectric conversion element 10A is simpler than that of the photoelectric conversion element 10. Accordingly, the photoelectric conversion element 10A is allowed to be manufactured easier than the photoelectric conversion element 10.

Modification 2

FIG. 9 illustrates a cross-sectional structure of a photoelectric conversion element 10B that is a second modification of the above-described photoelectric conversion element 10. The photoelectric conversion element 10B has the crystal silicon layer 26 as the photoelectric conversion film in the red photoelectric conversion section 20R as well as an organic semiconductor layer 27 as the photoelectric conversion film in the green photoelectric conversion section 20G. The organic semiconductor layer 27 is formed of an organic semiconductor that absorbs and photoelectrically converts the green light and allows light in other wavelength range to pass therethrough. Accordingly, the blue light is selectively absorbed and photoelectrically converted by the nanoparticle layer 22B, the green light is selectively absorbed and photoelectrically converted by the organic semiconductor layer 27, and the red light is selectively absorbed and photoelectrically converted by the crystal silicon layer 26. Even in this case, effects similar to those by the photoelectric conversion element 10 are obtainable.

The organic semiconductor in the organic semiconductor layer 27 may be desirably configured to contain one or both of an organic p-type semiconductor and an organic n-type semiconductor. As such an organic semiconductor, one of a quinacridone derivative, a naphthalene derivative, an anthracene derivative, a phenanthrene derivative, a tetracene derivative, a pyrene derivative, a perylene derivative, and a fluoranthene derivative is suitably used. Alternatively, a polymer of phenylenevinylene, fluorene, carbazole, indole, pyrene, pyrrol, picoline, thiophene, acetylene, diacetylene, or the like, or a derivative thereof may be used. In addition, metal complex dyes, rhodamine dyes, cyanine dyes, merocyanine dyes, phenylxanthene dyes, triphenylmethane dyes, rhodacyanine dyes, xanthene dyes, macrocyclic azaannulene dyes, azulene dyes, naphthoquinone dyes, anthraquinone dyes, chain compounds with condensed polycyclic aromatic compound and aromatic ring such as anthracene and pyrene or condensed heterocyclic compound, or two nitrogen-containing heterocyclic ring with squarylium group and croconic methine group as a binding chain, such as quinoline, benzothiazole, and benzoxazole, or dyes similar to cyanine dyes bound by squarylium group and croconic methine group may be preferably used. Note that, as the above-described metal complex dyes, ditiol metal complex dyes, metal phthalocyanine dyes, metalloporphyrin dyes, or ruthenium complex dyes are preferable; however, the metal complex dyes are not limited thereto. Moreover, in the photoelectric conversion element 10B, the crystal silicon layer 26 is employed in place of the semiconductor nanoparticle layer 22R, and the organic semiconductor layer 27 is employed in place of the semiconductor nanoparticle layer 22G. Therefore, the structure of the photoelectric conversion element 10B is simpler than the structure of the photoelectric conversion elements 10 and 10A that includes the plurality of semiconductor nanoparticle layers, and the photoelectric conversion element 10B is manufactured relatively easily.

Second Embodiment

Structure of Photoelectric Conversion Element 50

FIG. 10 illustrates a cross-sectional structure of a photoelectric conversion element 50 according to a second embodiment of the disclosure. For example, the photoelectric conversion element 50 may be configured by stacking and forming a transparent electrode 52, an electron transport layer 53, a semiconductor nanoparticle layer (hereinafter, referred to as a nanoparticle layer) 54, a hole transport layer 55, and a reflective electrode 56 in order on a transparent glass substrate 51 with a circuit forming layer (not illustrated) in between. The nanoparticle layer 54 is formed of a predetermined semiconductor material, and absorbs and photoelectrically converts wavelength light corresponding to the substance, as with the nanoparticle layers 22R, 22G, and 22B in the above-described first embodiment. Note that, in place of the glass substrate 51, a transparent substrate formed of a material other than glass, or a semiconductor substrate having a band gap higher than that of the incident light to be photoelectrically converted may be used.

Operation of Photoelectric Conversion Element 50

In the photoelectric conversion element 50, the light L enters a surface 51S1 of the glass substrate 51. The incident light L sequentially passes through the glass substrate 51 the transparent electrode 52, and the electron transport layer 53, and then reaches the nanoparticle layer 54. Light in a wavelength range inherent in the substance is absorbed by the nanoparticle layer 54, and the light is photoelectrically converted. Light that has not been absorbed by the nanoparticle layer 54 and has passed through the nanoparticle layer 54 is reflected by the reflective electrode 56 through the hole transport layer 55, and travels toward the nanoparticle layer 54 again. Light that has not been absorbed by the nanoparticle layer 54 again is emitted to the outside after passing through the electron transport layer 53, the transparent electrode 52, and the glass substrate 51.

Function and Effects of Photoelectric Conversion Element 50

Also in the photoelectric conversion element 50, a function similar to that of the photoelectric conversion element 10 in the above-described first embodiment is allowed to be exerted. In other words, since the photoelectric conversion element 50 has the nanoparticle layer 54 that contains the plurality of semiconductor nanoparticles each having a radius equal to or larger than the exciton Bohr radius, the light absorption characteristics inherent in the semiconductor configuring the semiconductor nanoparticle is allowed to be obtained without allowing the quantum confinement effect to be exerted.

Overall Configuration of Image Pickup Device

FIG. 11 is a functional block diagram illustrating the image pickup device 101 that uses the photoelectric conversion element described in any of the above-described embodiments, in each pixel. The image pickup device 101 is a CMOS image sensor, and has a pixel section 101a as an image pickup region and a circuit section 130 that may include, for example, a row scan section 131, a horizontal selection section 133, a column scan section 134, and a system control section 132. The circuit section 130 may be provided in a peripheral region of the pixel section 101a while being stacked on the peripheral region of the pixel section 101a or the pixel section 101a, or may be provided (in a region opposing to the pixel section 101a) while being stacked on the pixel section 101a.

For example, the pixel section 101a may have a plurality of unit pixels P (each corresponding to the photoelectric conversion element 10) that are two-dimensionally arranged in a matrix. For example, pixel drive lines Lread (specifically, column selection lines and reset control lines) are connected to the unit pixels P for each pixel row, and vertical signal lines Lsig are connected to the unit pixels P for each pixel column. Each of the pixel drive lines Lread transmits a drive signal for readout of signals from the pixels. One end of each of the pixel drive lines Lread is connected to an output end corresponding to each row of the row scan section 131.

The row scan section 131 is a pixel drive section that is configured of a shift resistor, an address decoder, or the like, and drives the pixels P of the pixel section 101a on a row basis. Signals output from the respective pixels P in the pixel row that is selectively scanned by the row scan section 131 are supplied to the horizontal selection section 133 through the respective vertical signal lines Lsig. The horizontal selection section 133 is configured of an amplifier, a horizontal selection switch, or the like that is provided for each vertical signal line Lsig.

The column scan section 134 is configured of a shift resistor, an address decoder, or the like, and sequentially drives the horizontal selection switches in the horizontal selection section 133 while scanning the horizontal selection switches. By the selection scanning by the column scan section 134, the signals of the respective pixels P that are transmitted through the respective vertical signal lines Lsig are transmitted to the horizontal signal lines 135 sequentially, and are output to the outside through the horizontal signal lines 135.

The system control section 132 receives clock provided from the outside and data instructing an operation mode, and outputs data such as internal information of the image pickup device 101. The system control section 132 further includes a timing generator generating various kinds of timing signals, and performs drive control of the row scan section 131, the horizontal selection section 133, the column scan section 134, and the like, based on the various kinds of timing signals generated by the timing generator.

Application Example

The above-described image pickup device 101 is applicable to all types of electronic apparatuses having an image pickup function, for example, a camera system such as a digital still camera and a video camera, a mobile phone having an image pickup function, and the like. FIG. 12 illustrates a schematic configuration of an electronic apparatus 102 (a camera) as an example. The electronic apparatus 102 may be a video camera capable of shooting a still image or a moving picture, for example, and includes the image pickup device 101, an optical system (an optical lens) 310, a shutter device 311, a drive section 313 that drives the image pickup device 101 and the shutter device 311, and a signal processing section 312.

The optical system 310 guides the image light (the incident light) from an object to the pixel section 101a of the image pickup device 101. The optical system 310 may be configured of a plurality of optical lenses. The shutter device 311 controls a light irradiation period and a light shielded period to the image pickup device 101. The drive section 313 controls transfer operation of the image pickup device 101 and shutter operation of the shutter device 311. The signal processing section 312 performs various kinds of signal processing on the signals output from the image pickup device 101, A signal-processed picture signal Dout is stored in a storage medium such as a memory or is output to a monitor or the like.

Hereinbefore, although the present disclosure has been described with referring to the embodiments and the modifications, the disclosure is not limited to the above-described embodiments and the like, and various modifications may be made. For example, in the photoelectric conversion element 10B of the above-described modification 2, the photoelectric conversion film of the red photoelectric conversion section 20R is configured of a crystal silicon layer, the photoelectric conversion film of the green photoelectric conversion section 20G is configured of an organic semiconductor layer, and the photoelectric conversion film of the blue photoelectric conversion section 20B is configured of a nanoparticle layer. However, the technology is not limited thereto. For example, as with a photoelectric conversion element 10C (a third modification) illustrated in Table 2, the photoelectric conversion film of the red photoelectric conversion section 20R may be configured of a crystal silicon layer, the photoelectric conversion film of the green photoelectric conversion section 20G may be configured of an inorganic semiconductor nanoparticle layer, and the photoelectric conversion film of the blue photoelectric conversion section 20B may be configured of an organic semiconductor layer. Alternatively, as with a photoelectric conversion element 10D (a fourth modification) illustrated in Table 2, the photoelectric conversion film of each of the red photoelectric conversion section 20R and the blue photoelectric conversion section 20B may be configured of an inorganic semiconductor nanoparticle layer, and the photoelectric conversion film of the green photoelectric conversion section 20G may be configured of an organic semiconductor layer. Further, as with a photoelectric conversion element 10E (a fifth modification) illustrated in Table 2, the photoelectric conversion film of each of the red photoelectric conversion section 20R and the green photoelectric conversion section 20G may be configured of an organic semiconductor layer, and the photoelectric conversion film of the blue photoelectric conversion section 20B may be configured of an inorganic semiconductor nanoparticle layer.

TABLE 2

| | Photoelectric Conversion Film | | |
|---|---|---|---|
| | Red | Green | Blue |
| Photoelectric Conversion Element 10 (First Embodiment) | Inorganic Semiconductor Nanoparticle | Inorganic Semiconductor Nanoparticle | Inorganic Semiconductor Nanoparticle |
| Photoelectric Conversion Element 10A (First Modification) | Crystal Si | Inorganic Semiconductor Nanoparticle | Inorganic Semiconductor Nanoparticle |
| Photoelectric Conversion Element 10B (Second Modification) | Crystal Si | Organic Semiconductor | Inorganic Semiconductor Nanoparticle |
| Photoelectric Conversion Element 10C (Third Modification) | Crystal Si | Inorganic Semiconductor Nanoparticle | Organic Semiconductor |
| Photoelectric Conversion Element 10D (Fourth Modification) | Inorganic Semiconductor Nanoparticle | Organic Semiconductor | Inorganic Semiconductor Nanoparticle |
| Photoelectric Conversion Element 10E (Fifth Modification) | Organic Semiconductor | Organic Semiconductor | Inorganic Semiconductor Nanoparticle |

Moreover, in the above-described embodiments and the like, the structure of the photoelectric conversion element 10, 10A to 10E, and 50 are specifically described; however, these do not necessarily have all of the components, and may further include other components. For example, in the photoelectric conversion element 10, the on-chip lens 33 may be not provided.

Note that the effects described in the present specification are merely exemplified, and are not limited to the description, and other effects may be obtained. In addition, the technology may be configured as follows.

(1) A semiconductor nanoparticle dispersion including:
a plurality of semiconductor nanoparticles each having a radius equal to or larger than an exciton Bohr radius; and
a solvent dispersed with the plurality of semiconductor nanoparticles.

(2) The semiconductor nanoparticle dispersion according to (1), wherein each of the semiconductor nanoparticles is formed of a binary mixed crystal.

(3) The semiconductor nanoparticle dispersion according to (1) or (2), wherein the plurality of semiconductor nanoparticles includes first particles each having a first radius and second particles each having a second radius.

(4) The semiconductor nanoparticle dispersion according to any one of (1) to (3), wherein each of the semiconductor nanoparticles is formed of zinc selenide compound (ZnSe), and has a radius equal to or larger than about 3.9 nm that is an exciton Bohr radius of ZnSe.

(5) The semiconductor nanoparticle dispersion according to (4), wherein each of the semiconductor nanoparticles is doped with an impurity element Ga or Cl as an n-type dopant within a range of about $10^{17}$ to $10^{19}$ cm$^{-3}$.

(6) The semiconductor nanoparticle dispersion according to (4) or (5), wherein each of the semiconductor nanoparticles is doped with an impurity element N, O, or Li as a p-type dopant within a range of about $10^{17}$ to $10^{19}$ cm$^{-3}$.

(7) The semiconductor nanoparticle dispersion according to any one of (1) to (3), wherein each of the semiconductor nanoparticles is formed of zinc telluride compound (ZnTe), and has a radius equal to or larger than about 5.4 nm that is an exciton Bohr radius of ZnTe.

(8) The semiconductor nanoparticle dispersion according to (7), wherein each of the semiconductor nanoparticles is doped with an impurity element Ga or Cl as an n-type dopant within a range of about $10^{17}$ to $10^{19}$ cm$^{-3}$.

(9) The semiconductor nanoparticle dispersion according to (7) or (8), wherein each of the semiconductor nanoparticles is doped with an impurity element N, O, or Li as a p-type dopant within a range of about $10^{17}$ to $10^{19}$ cm$^{-3}$.

(10) A photoelectric conversion element including:
a photoelectric conversion layer that contains a plurality of semiconductor nanoparticles each having a radius equal to or larger than an exciton Bohr radius; and
a pair of electrodes opposing to each other with the photoelectric conversion layer in between.

(11) The photoelectric conversion element according to (10), wherein a radius of each of the semiconductor nanoparticles is equal to or smaller than one-twentieth of absorption peak wavelength of the photoelectric conversion layer.

(12) The photoelectric conversion element according to (10) or (11), wherein each of the semiconductor nanoparticles is formed of a binary mixed crystal.

(13) The photoelectric conversion element according to any one of (10) to (12), wherein the plurality of semiconductor nanoparticles includes first particles each having a first radius and second particles each having a second radius.

(14) The photoelectric conversion element according to any one of (10) to (13), wherein each of the semiconductor nanoparticles is formed of zinc selenide compound (ZnSe), and has a radius equal to or larger than about 3.9 nm that is an exciton Bohr radius of ZnSe.

(15) The photoelectric conversion element according to (14), wherein each of the semiconductor nanoparticles is doped with an impurity element Ga or Cl as an n-type dopant within a range of about $10^{17}$ to $10^{19}$ $cm^{-3}$.

(16) The photoelectric conversion element according to (14) or (15), wherein each of the semiconductor nanoparticles is doped with an impurity element N, O, or Li as a p-type dopant within a range of about $10^{17}$ to $10^{19}$ $cm^{-3}$.

(17) The photoelectric conversion element according to any one of (10) to (13), wherein each of the semiconductor nanoparticles is formed of zinc telluride compound (ZnTe), and has a radius equal to or larger than about 5.4 nm that is an exciton Bohr radius of ZnTe.

(18) The photoelectric conversion element according to (17), wherein each of the semiconductor nanoparticles is doped with an impurity element Ga or Cl as an n-type dopant within a range of about $10^{17}$ to $10^{19}$ $cm^{-3}$.

(19) The photoelectric conversion element according to (17) or (18), wherein each of the semiconductor nanoparticles is doped with an impurity element N, O, or Li as a p-type dopant within a range of about $10^{17}$ to $10^{19}$ $cm^{-3}$.

(20) An image pickup device provided with a plurality of photoelectric conversion elements as pixels, each of the photoelectric conversion elements including:
a photoelectric conversion layer that contains a plurality of semiconductor nanoparticles each having a radius equal to or larger than an exciton Bohr radius; and
a pair of electrodes opposing to each other with the photoelectric conversion layer in between.

(21) A semiconductor nanoparticle dispersion comprising:
a plurality of semiconductor nanoparticles having a radius equal to or larger than an exciton Bohr radius; and
a solvent dispersed with the plurality of semiconductor nanoparticles.

(22) The semiconductor nanoparticle dispersion according to (21), wherein the semiconductor nanoparticles include a binary mixed crystal.

(23) The semiconductor nanoparticle dispersion according to (21), wherein the plurality of semiconductor nanoparticles include first particles having a first radius and second particles having a second radius.

(24) The semiconductor nanoparticle dispersion according to (21), wherein the semiconductor nanoparticles include a zinc selenide compound (ZnSe), and have a radius equal to or larger than about 3.9 nm that is an exciton Bohr radius of ZnSe.

(25) The semiconductor nanoparticle dispersion according to (24), wherein the semiconductor nanoparticles include an n-type dopant within a range of about 1017 to 1019 cm-3, wherein the n-type dopant is an impurity element including any one of Ga and Cl.

(26) The semiconductor nanoparticle dispersion according to (24), wherein the semiconductor nanoparticles include a p-type dopant within a range of about $10^{17}$ to $10^{19}$ $cm^{-3}$, wherein the p-type dopant is an impurity element including any one of N, O, and Li.

(27) The semiconductor nanoparticle dispersion according to (21), wherein the semiconductor nanoparticles include a zinc telluride compound (ZnTe), and have a radius equal to or larger than about 5.4 nm that is an exciton Bohr radius of ZnTe.

(28) The semiconductor nanoparticle dispersion according to (27), wherein the semiconductor nanoparticles include an n-type dopant within a range of about 1017 to 1019 cm-3, wherein the n-type dopant is an impurity element including any one of Ga and Cl.

(29) The semiconductor nanoparticle dispersion according to (27), wherein the semiconductor nanoparticles include a p-type dopant within a range of about 1017 to 1019 cm-3, wherein the p-type dopant is an impurity element including N, O, and Li.

(30) The semiconductor nanoparticle dispersion according to (21), wherein the radius is an average radius associated with the semiconductor nanoparticles.

(31) A photoelectric conversion element comprising:
a photoelectric conversion layer that contains a plurality of semiconductor nanoparticles having a radius equal to or larger than an exciton Bohr radius; and
a pair of electrodes opposing to each other with the photoelectric conversion layer in between.

(32) The photoelectric conversion element according to (31), wherein a radius of the semiconductor nanoparticles is equal to or smaller than one-twentieth of absorption peak wavelength of the photoelectric conversion layer.

(33) The photoelectric conversion element according to (31), wherein the semiconductor nanoparticles include a binary mixed crystal.

(34) The photoelectric conversion element according to (31), wherein the plurality of semiconductor nanoparticles includes first particles having a first radius and second particles having a second radius.

(35) The photoelectric conversion element according to (31), wherein the semiconductor nanoparticles include a zinc selenide compound (ZnSe), and have a radius equal to or larger than about 3.9 nm that is an exciton Bohr radius of ZnSe.

(36) The photoelectric conversion element according to (35), wherein the semiconductor nanoparticles include an n-type dopant within a range of about 1017 to 1019 cm-3, wherein the n-type dopant is an impurity element including any one of Ga and Cl.

(37) The photoelectric conversion element according to (35), wherein the semiconductor nanoparticles include a p-type dopant within a range of about 1017 to 1019 cm-3, wherein the p-type dopant is an impurity element including any one of N, O, and Li.

(38) The photoelectric conversion element according to (31), wherein the semiconductor nanoparticles include a zinc telluride compound (ZnTe), and have a radius equal to or larger than about 5.4 nm that is an exciton Bohr radius of ZnTe.

(39) The photoelectric conversion element according to (38), wherein the semiconductor nanoparticles include an n-type dopant within a range of about 1017 to 1019 cm-3, wherein the n-type dopant is an impurity element including any one of Ga and Cl.

(40) The photoelectric conversion element according to (38), wherein the semiconductor nanoparticles include a p-type dopant within a range of about 1017 to 1019 cm-3, wherein the p-type dopant is an impurity element including any one of N, O, and Li.

(41) The photoelectric conversion element according to (31), wherein the radius is an average radius of the semiconductor nanoparticles.

(42) An image pickup device including a plurality of photoelectric conversion elements as pixels, at least one of the photoelectric conversion elements comprising:
a photoelectric conversion layer that contains a plurality of semiconductor nanoparticles having a radius equal to or larger than an exciton Bohr radius; and
a pair of electrodes opposing to each other with the photoelectric conversion layer in between.

It should be understood by those skilled in the art that various modifications, combinations, sub-combinations and alterations may occur depending on design requirements and other factors insofar as they are within the scope of the appended claims or the equivalents thereof.

INDUSTRIAL APPLICABILITY

The photoelectric conversion element according to any of the embodiments of the disclosure is not limited to application to the above-described image pickup device. For example, the photoelectric conversion element according to any of the embodiments of the disclosure is applicable to an optical sensor that uses a property of absorbing light in a specific wavelength range to detect presence or absence of the light in the specific wavelength range.

REFERENCE SIGNS LIST 10, 10A to 10E Photoelectric conversion element
11 Semiconductor substrate
12, 24, 25 Insulating layer
20R Red photoelectric conversion section
20G Green photoelectric conversion section
20B Blue photoelectric conversion section
21R, 21G, 21B First electrode
22R, 22G, 22B Nanoparticle layer
23R, 23G, 23B Second electrode
26 Crystal silicon layer
27 Organic semiconductor layer
31 Protective layer
32 Planarizing layer
33 On-chip lens
110 Silicon layer
110R Red storage layer
110G Green storage layer
110B Blue storage layer

The invention claimed is:

1. A semiconductor nanoparticle dispersion, comprising:
a plurality of first semiconductor nanoparticles having a radius substantially equal to an exciton Bohr radius of a material of the plurality of first semiconductor nanoparticles;
a plurality of second semiconductor nanoparticles mixed with the plurality of first semiconductor nanoparticles, wherein
the plurality of second semiconductor nanoparticles has a radius larger than an exciton Bohr radius of a material of the plurality of second semiconductor nanoparticles, and
the plurality of second semiconductor nanoparticles is different from the plurality of first semiconductor nanoparticles; and
a solvent dispersed with the plurality of first semiconductor nanoparticles and the plurality of second semiconductor nanoparticles.

2. The semiconductor nanoparticle dispersion according to claim 1, wherein
each of the plurality of first semiconductor nanoparticles includes a zinc selenide compound (ZnSe),
the radius of each of the plurality of first semiconductor nanoparticles is equal to the exciton Bohr radius of ZnSe, and
the exciton Bohr radius of ZnSe is 3.9 nm.

3. The semiconductor nanoparticle dispersion according to claim 2, wherein
each of the plurality of first semiconductor nanoparticles further includes an n-type dopant within a range of $10^{17}$ to $10^{19}$ $cm^{-3}$, and
the n-type dopant is an impurity element including one of Ga or Cl.

4. The semiconductor nanoparticle dispersion according to claim 2, wherein
each of the plurality of first semiconductor nanoparticles further includes a p-type dopant within a range of $10^{17}$ to $10^{19}$ $cm^{-3}$, and
the p-type dopant is an impurity element including one of N, O, or Li.

5. The semiconductor nanoparticle dispersion according to claim 1, wherein
each of the plurality of first semiconductor nanoparticles includes a zinc telluride compound (ZnTe),
the radius of each of the plurality of first semiconductor nanoparticles is equal to the exciton Bohr radius of ZnTe, and
the exciton Bohr radius of ZnTe is 5.4 nm.

6. The semiconductor nanoparticle dispersion according to claim 5, wherein
each of the plurality of first semiconductor nanoparticles further includes an n-type dopant within a range of $10^{17}$ to $10^{19}$ $cm^{-3}$, and
the n-type dopant is an impurity element including one of Ga or Cl.

7. The semiconductor nanoparticle dispersion according to claim 5, wherein
each of the plurality of first semiconductor nanoparticles further includes a p-type dopant within a range of $10^{17}$ to $10^{19}$ $cm^{-3}$, and
the p-type dopant is an impurity element including at least one of N, O, or Li.

8. The semiconductor nanoparticle dispersion according to claim 1, wherein the radius is an average radius associated with the plurality of first semiconductor nanoparticles.

9. A photoelectric conversion element, comprising:
a photoelectric conversion layer that comprises a plurality of first semiconductor nanoparticles and a plurality of second semiconductor nanoparticles, wherein
the plurality of first semiconductor nanoparticles has a radius substantially equal to an exciton Bohr radius of a material of the plurality of first semiconductor nanoparticles,
the plurality of second semiconductor nanoparticles is mixed with the plurality of first semiconductor nanoparticles,
the plurality of second semiconductor nanoparticles has a radius larger than an exciton Bohr radius of a material of the plurality of second semiconductor nanoparticles, and the plurality of second semiconductor nanoparticles is different from the plurality of first semiconductor nanoparticles; and a pair of electrodes that oppose each other, wherein the photoelectric conversion layer is in between the pair of electrodes.

10. The photoelectric conversion element according to claim 9, wherein the radius of each of the plurality of first semiconductor nanoparticles is equal to or smaller than one-twentieth of absorption peak wavelength of the photoelectric conversion layer.

11. The photoelectric conversion element according to claim 9, wherein each of the plurality of first semiconductor nanoparticles includes a zinc selenide compound (ZnSe), the radius of each of the plurality of first semiconductor nanoparticles is equal to the exciton Bohr radius of ZnSe, and the exciton Bohr radius of ZnSe is 3.9 nm.

12. The photoelectric conversion element according to claim 11, wherein each of the plurality of first semiconductor nanoparticles further includes an n-type dopant within a range of $10^{17}$ to $10^{19}$ $cm^{-3}$, and the n-type dopant is an impurity element including one of Ga or Cl.

13. The photoelectric conversion element according to claim 11, wherein each of the plurality of first semiconductor nanoparticles further includes a p-type dopant within a range of $10^{17}$ to $10^{19}$ $cm^{-3}$, and the p-type dopant is an impurity element including one of N, O, or Li.

14. The photoelectric conversion element according to claim 9, wherein each of the plurality of first semiconductor nanoparticles includes a zinc telluride compound (ZnTe), the radius of each of the plurality of first semiconductor nanoparticles is equal to the exciton Bohr radius of ZnTe, and the exciton Bohr radius of ZnTe is 5.4 nm.

15. The photoelectric conversion element according to claim 14, wherein each of the plurality of first semiconductor nanoparticles further includes an n-type dopant within a range of $10^{17}$ to $10^{19}$ $cm^{-3}$, and the n-type dopant is an impurity element including one of Ga or Cl.

16. The photoelectric conversion element according to claim 14, wherein each of the plurality of first semiconductor nanoparticles further includes a p-type dopant within a range of $10^{17}$ to $10^{19}$ $cm^{-3}$, and the p-type dopant is an impurity element including one of N, O, or Li.

17. The photoelectric conversion element according to claim 9, wherein the radius is an average radius of the plurality of first semiconductor nanoparticles.

18. An image pickup device, comprising:

a plurality of photoelectric conversion elements as pixels, wherein at least one photoelectric conversion element of the plurality of photoelectric conversion elements comprises:

a photoelectric conversion layer that comprises a plurality of first semiconductor nanoparticles and a plurality of second semiconductor nanoparticles, wherein the plurality of first semiconductor nanoparticles has a radius substantially equal to an exciton Bohr radius of a material of the first plurality of semiconductor nanoparticles, the plurality of second semiconductor nanoparticles is mixed with the plurality of first semiconductor nanoparticles, the plurality of second semiconductor nanoparticles has a radius larger than an exciton Bohr radius of a material of the plurality of second semiconductor nanoparticles, and the plurality of second semiconductor nanoparticles is different from the plurality of first semiconductor nanoparticles; and a pair of electrodes that oppose each other, wherein the photoelectric conversion layer is in between the pair of electrodes.

* * * * *